Figure 1:
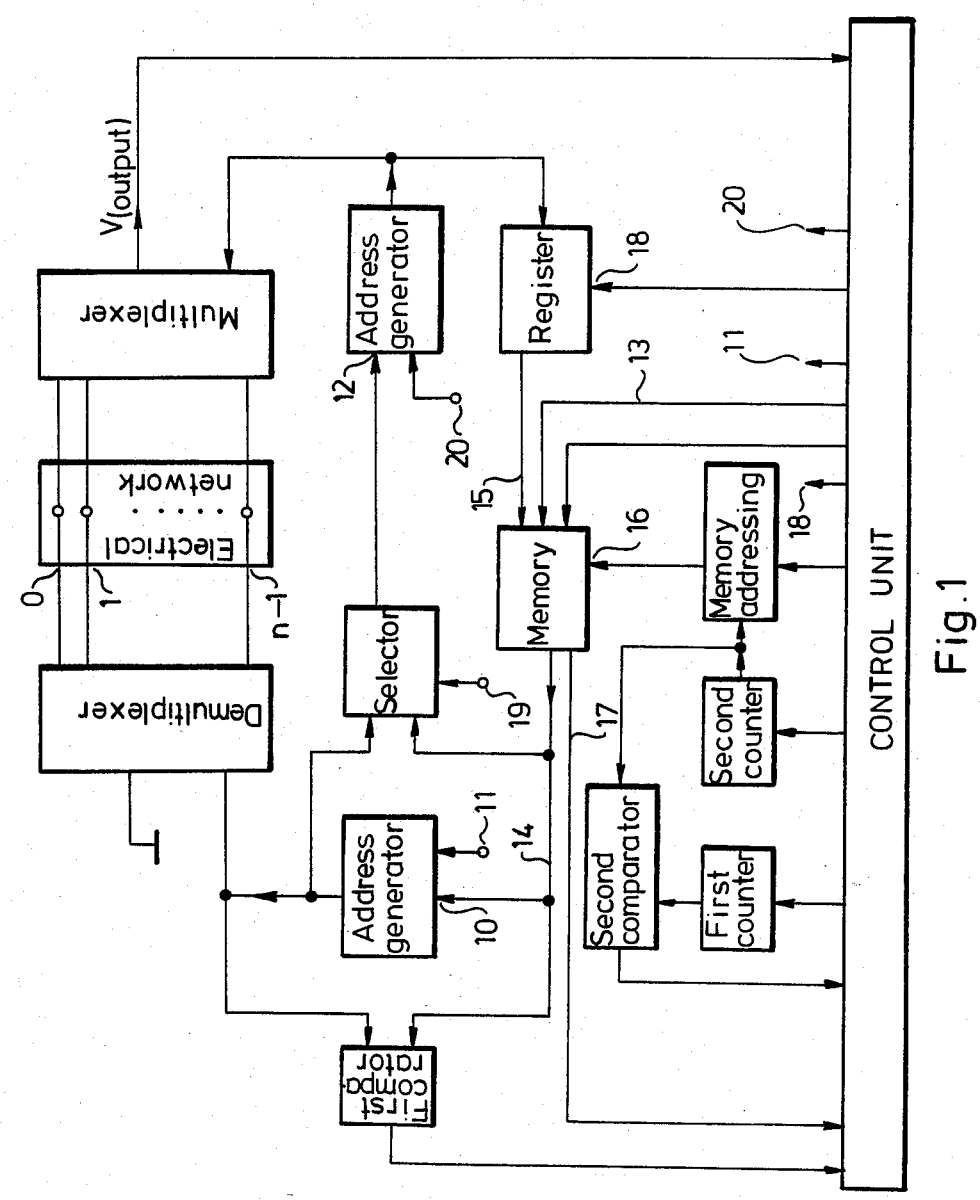

United States Patent [19]

Somlai et al.

[11] Patent Number: 4,597,072

[45] Date of Patent: Jun. 24, 1986

[54] METHOD AND APPARATUS FOR THE EXAMINATION OF THE INTERNAL INTERCONNECTION SYSTEM BETWEEN N TERMINALS OF AN ELECTRICAL NETWORK

[75] Inventors: Lajos Somlai; Kálmán Gálos, both of Budapest, Hungary

[73] Assignee: Vilati Villamos Automatika, Budapest, Hungary

[21] Appl. No.: 621,906

[22] PCT Filed: Nov. 15, 1983

[86] PCT No.: PCT/HU83/00056

§ 371 Date: Jun. 15, 1984

§ 102(e) Date: Jun. 15, 1984

[87] PCT Pub. No.: WO84/02015

PCT Pub. Date: May 24, 1984

[30] Foreign Application Priority Data

Nov. 15, 1982 [HU] Hungary .................. 3660/82

[51] Int. Cl.[4] .......................... H04J 1/16; H04J 3/14
[52] U.S. Cl. .............................. 370/14; 370/17
[58] Field of Search ............. 370/13, 14, 17; 364/737; 375/10

[56] References Cited

U.S. PATENT DOCUMENTS

| | | | |
|---|---|---|---|
| 4,247,934 | 1/1981 | Parras | 375/10 |
| 4,254,495 | 3/1981 | Bollard | 370/14 |
| 4,302,836 | 11/1981 | Bouvier d'Ivoire et al. | 370/14 |
| 4,320,497 | 3/1982 | Mori et al. | 370/14 |
| 4,340,788 | 7/1982 | Sbuelz | 370/17 |
| 4,402,074 | 8/1983 | Cupuis et al. | 370/14 |
| 4,449,247 | 5/1984 | Waschka, Jr. | 375/10 |
| 4,491,838 | 1/1985 | West | 370/14 |

Primary Examiner—Douglas W. Olms
Assistant Examiner—Kenneth I. Rokoff
Attorney, Agent, or Firm—Handal & Morofsky

[57] ABSTRACT

A method for the examination of an internal interconnection system between n terminals of an electrical network and for storing the results in a memory comprising n memory cells by means of measuring the existence or non-existence of the signal passage between the terminals, in which a demultiplexer is used to pass a marking state on a terminal of the network and a multiplexer is used to detect the throughpass of the marking signal to other terminals of the network in first cycles a, and when such passage is detected, the positions of the demultiplexer and the multiplexer are stored together with a so called closing bit representing the end of a series of interconnections, and in subsequent cycles b the next undetected terminal is determined which is followed by a next cycle a, and this sequence is continued until all interconnections of the network get stored in the memory. In the apparatus for carrying out the method a first address generator (DMC) is associated with the demultiplexer (DMPX) and a second one (MPC) with the multiplexer (MPX), and a memory (MEM) is used to set the multiplexer. The setting of the multiplexer is temporarily stored in a register (REG) which is subsequently read in the memory. The memory sets the demultiplexer to the selected terminals. The memory setting is facilitated by a memory addressing circuit (MEC). The apparatus is designed to function in accordance with the method and comprises a pair of comparators storing threshold values used for the logical minimizing operations defining the actual fresh memory addresses.

8 Claims, 3 Drawing Figures

| DMC | MEC | MEM DATA | Z |
|---|---|---|---|
| 0 | 0 | 0 | 0 |
| 1 | 1 | 1 | 1 |
| 1 | 2 | 3 | 0 |
| 2 | 3 | 2 | 1 |
| 2 | 4 | 4 | 1 |
| 2 | 5 | 5 | 0 |
| 6 | 6 | 6 | 0 |
|   |   | ⋮ |   |
| n−1 | n−1 | n−1 | 0 |

METHOD AND APPARATUS FOR THE EXAMINATION OF THE INTERNAL INTERCONNECTION SYSTEM BETWEEN N TERMINALS OF AN ELECTRICAL NETWORK

The invention relates to a method for the examination of the internal interconnection system between n terminals of an electrical network and for storing the results of examination in a memory with n memory cells by means of measuring the existence or non-existence of signal passage between the terminals. The invention relates also to a method which can test an electrical network manufactured as a reproduction of a standard electrical network which has an interconnection system already examined and stored in a memory, such test including the indication of the differences between the tested and the standard networks. The invention relates to an apparatus for carrying out both kinds of method.

As it is widely known in the art in the field of manufacturing electrical networks with a large number of terminals the examination or control test of the interconnection system between the terminals is of outstanding significance.

In making such examinations information of "yes" or "no" type is required indicating whether there exists a connection between a tested pair of terminals or it is not existing. In general, the existence of a connection can be established if the electrical resistance between the terminals is below a threshold limit, and there is no connection, if the resistance is higher than the threshold limit.

Especialy in case of networks with large number of terminals (such as exceeding a couple of hundred or thousand terminals) the performance of such examinations is rather complicated and requires the usage of highly expensive machinery. The degree of complexity increases excessively with the number of terminals and the equipments designed for operating with smaller number of terminals can not be expanded due to theoretical considerations, because extending the number of terminals, certain inevitable additional problems will emerge. The main problem lies in that in the electrical network in principle an unlimited proportion of terminals can be galvanically interconnected to form a common point, and among the testing circuits connected to these terminals unwanted couplings and interactions might take place.

For the examination of networks with a large number of terminals computers are used due to the excessively large number of possible combinations, and the data defining the respective status conditions are stored in the memory of the computer. As far as we are informed, there have not been published any electronic means with self-programming performance which could automatically examine the internal structure of interconnections of an unknown electrical network.

The object of the invention is to provide a method and an apparatus for the examination and test of the internal interconnection system of an electrical network with a plurality of terminals which is capable of investigating the structure of interconnections of an unknown network by means of self-programming steps, which does not require complicated processor operations or even the usage of a processor and which has a minimized need for storage capacity that does not exceed the number of terminals of the network, i.e. in which the stored information has a minimum redundancy.

In a first aspect of the invention a method has been provided for the examination of an internal interconnection system between n terminals of an electrical network and for storing the results in a memory comprising n memory cells by means of measuring the existence or non-existence of the signal passage between the terminals, in which according to the invention the method comprises the steps of switching a marking state on the respective terminals by means of a demultiplexer with n outputs controlled by an address generator and searching the passage of the marking state by a multiplexer with n inputs connected to the terminals and being set by an other address generator, and in each stable state of the demultiplexer the throughpass of the marking state being searched according to steps of first cycles designated as cycles A, in each of said cycles A said multiplexer is stepped from the terminal associated with said stable state of the demultiplexer till the last terminal, and in each step watching the state of the multiplexer output and if in that output an active state representing the throughpass of said marking state is detected, the actual address of the multiplexer is temporarily stored and when the next active state in said output is detected, the temporarily stored address is written in the momentarily addressed cell of the memory together with a closing bit having a first logical value associated with said active state, whereafter the next address of the memory is set and the momentary multiplexer address is stored temporarily, and this repeated sequence of steps is continued until the multiplexer is connected to the n-th, last terminal, and in the next step the temporarily stored address is written in the next free address of the memory together with a closing bit having a second logical value inverted relative to said first logical value and stepping the memory to the next address, then starting a second B-type cycle for adjusting the next stable state of the demultiplexer, in which the demultiplexer address is increased by respective steps and in each step this address is compared with the contents of the already filled memory cells and if identity is found, the demultiplexer address is increased by a step and this increased step is compared to the content of the already written memory cells beginning with the first cell, and if neither of the contents of the filled memory cells is found to coincide the actual demultiplexer address, then this latter is accepted as a stable demultiplexer address, then starting a further cycle A, and by means of the alternating series of the cycles A and B all the n cell of the memory being written in.

According an other aspect of the invention a method has been provided for testing the identity of an internal interconnection system interpreted among terminals of a network with that of a standard network, in which the internal interconnection of the standard network is recorded in a memory according to the above described method and according to the invention this method is characterized by the steps of switching a marking state on the respective terminals of the network under test by means of a demultiplexer addressed by an address generator, and by means of a multiplexer with inputs connected to said terminals and addressed by a second address generator, the arrival of the marking state to the multiplexer output is tested as a proof of short-circuit or as a continuty test between the actually connected terminals, and the short-circuit and continuity test examinations are carried out in alternating cycles, and in the short circuit control cycles the demultiplexer is set to addresses for which is true that in the memory cell with the same address the value of the closing bit corresponds to said second logical value, and during maintaining such demultiplexer states the memory address is increased by steps and in each step the memory content is read, and when the read value of the closing bit corresponds to said second logical value, then the multiplexer is set to the address stored in the same memory cell and the output state there of is examined, and if in this output the marking state that is a short-circuit is detected, then an error indication is made, following the end of each of said first cycles the memory cell with the next address is read and the demultiplexer is set to the position corresponding to the number stored in this cell, and if the value of the closing bit stored in this cell takes the second logical value, then an other short-circuit test cycle is started, and if the closing bit has the other i.e. first logical value, then a second type continuity test cycle is started, in which the multiplexer is set to the position determined by the number stored in the memory cell with the next address, and the state of the multiplexer output is detected, and if the lack of marking state i.e. continuity is measured, an error indication is made, and if continuity is detected, then the demultiplexer is set to the position defined by the number stored in the memory cell with said next address and depending on the value of the closing bit stored in this cell a further short-circuit or continuity test cycle is started.

In a preferable embodiment of this method the tests are carried out in a range defined between two predetermined limit memory addresses, in which the demultiplexer is set first to the position stored in one of said limit addresses, and the type of the first cycle is defined by the logical value of the closing bit in this address.

According to a further aspect of the invention an apparatus has been provided by which both the examination and control test methods can be carried out and this apparatus comprises a demultiplexer with outputs connected to the n terminal of the network under test, a multiplexer with inputs connected to said terminals, a first address generator connected to address input of the demultiplexer, a second address generator connected to address input of the multiplexer, a register connected to the output of the multiplexer for temporarily storing the value of this output, a selector which can be set according to the required mode of operation and which has an output connected to address input of the second address generator, a first input connected to the output of the first address generator, a memory comprising n cells which has data inputs connected with one exception to the outputs of the register, the data output of the memory are connected with one exception to the address input of the first address generator and to second input of the selector, a memory addressing circuit coupled to the address inputs of the memory, a means for determining the identity of the memory content and the actual position of the first address generator, a means for temporary storage of given states of the memory addressing circuit and for indicating the fact when the memory addressing circuit takes said states again and a control unit which receives the output of the multiplexer, the remaining one data output of the memory, the output of the means for determining the identity, the output of the temporary storage means, said control unit comprises control outputs for setting the remaining one data input of the memory and for controlling the first and second address generators, the selector, the register, the memory addressing circuit and the memory.

The method according to the invention both during performance of examination and test tasks takes the information, obtained about the network earlier, into consideration, therefore the number of examining steps is minimized and the number of memory cells required for storing the results of examination will also be at minimum. Owing to the usage of the closing bit the internal structure of the network is stored in the consecutive memory addresses in logical groups in such a way that in a group the closing bit of the interconnected terminals has a logical "1" value till the last number of the group which has a logical "0" value. Such way of information storage facilitates the identification of the erroneous connections and the search.

Figures 2, 3:
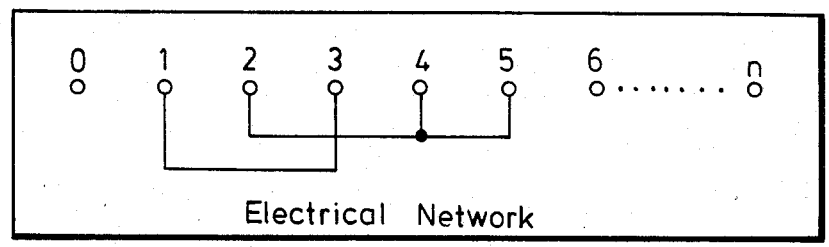

The invention will now be described in connection with examplary embodiments thereof, in which reference will be made to the accompanying drawings. In the drawing:

FIG. 1 shows the general block diagram of the apparatus according to the invention, FIG. 2 shows a detail from a portion of the network to be tested, and FIG. 3 visualizes the filling of the memory in table form.

FIG. 1 shows an electrical network NW which comprises "n" terminals. In the network the terminals are interconnected according to an internal structure corresponding to the task and function of the network NW. These interconnections are of "yes" or "no" type, and the value of any particular connection can be established on the basis of the electrical resistance measured between the corresponding terminals i.e. whether this resistance is beyond or below a predetermined threshold level. The structure of internal interconnections among the "n" terminals can be unknown, and in that case the task lies in the examination and the storage of the examined structure, or this structure can be already known and available in a stored form, and in that case the task lies in the control of the actual structure of interconnections of a tested network whether it fully corresponds to the stored predetermined structure. The performance of these two tasks requires basically differring implementations. In the following description the first task will be referred to shortly as "examination" and the second one as "control" or "tests". The value of "n" can be as high as several hundred or even several thousand or tens of thousand. From this high number it will be clear that the accomplishment of these tasks can not be too simple.

In FIG. 1 its is shown that the terminals of the network NW are connected to number n outputs of a demultiplexer DMPX and to number n inputs of a multiplexer MPX. The actual state of the demultiplexer DMPS is defined by address generator DMC and that of the multiplexer MPX is defined by address generator MPC. The address generator MPC has a data input 12 and a control input 20. The demultiplexer DMPX supplies a ground potential to the output addressed by the address generator MPC, while the electrical state of the output V of the multiplexer MPX is high or low depending on the electrical state of the path resistance between the addressed multiplexer input towards the ground i.e. whether this path is closed or broken.

The actual state of the address generator DMC is defined by the signals present in its data input 10 and control input 11 (such as shifting, writing or clearing inputs). The address delivered at the output of the address generator DMC is coupled not only to the address input of the demultiplexer DMPX but also to first input of a first comparator KOM 1 and to an input of selector SEL. The output of the selector SEL is connected to the data input of the address generator MPC, and the actual position of the selector SEL is defined by the control coupled to mode control input 19 thereof.

The apparatus comprises a memory MEM with number n addressable memory cells with data inputs connected with one exception through line 15 to output of register REG and the remaining one input is connected through line 13 to control unit CU for the storage of a closing bit 2 (to be explained later). The data inputs of the register REG are connected to the output of the address generator MPC, and the control input 18 of the register REG is connected to the control unit CU.

Address inputs 16 of the memory MEM are connected to output of memory addressing circuit MEM having an input coupled to output of a second counter CNT 2 and to an input of second comparator KOM 2. The other input of the second comparator KOM 2 is connected to output of first counter CNT 1. The first counter CNT 1 is controlled as it will be described later together with the memory addressing circuit MEC and stores the state of the memory addressing circuit MEC when this latter should be stepped during a sub-cycle. The data outputs of the memory MEM—with the exception of the output corresponding to the closing bit—are connected through line 14 to the data input 10 of the address generator DMC, to the second input of the first comparator KCM 1 and to second input of the selector SEL. The data output of the closing bit is connected through line 17 to the control unit CU. The outputs of both comparators KOM 1 and KOM 2 and the output V are connected to respective terminals of the control unit CU.

The task of the control unit CU is the coordination of the operation of the whole apparatus and for that reason the control unit CU is connected to the writing, shifting, clearing and enable i.e. in general control inputs of all functional units of the apparatus and to the mode control input 19 of the selector SEL. The control unit CU can be implemented by a sequential logical circuit or by a processor controlled unit, however, the structural design of the control unit CU can be less complicated if the functional units such as the address generators DMC and MPC, the memory addressing circuit MEC and the register REG are designed for high performance control i.e. if these units have writing, stepping, shifting, reset etc. properties. The memory MEM receives the control signals required for its normal operation also from the control unit CU. For the sake of preserving transparency of FIG. 1 the connections between certain outputs and inputs of the functional units and the control units have been symbolized by identical reference numbers instead of interconnecting lines.

The operation of the appratus according to the invention and the implementation of the method will be described in connection with solving exemplary tasks.

When a network NW with unknown internal structure is examined, the task lies in the establishment of the internal structure between the terminals and in the storage of the established structure in a memory. If in case of a network of a given type the internal structure has already been established, then in case of other manufactured similar networks should be checked or controlled whether their internal structure actually correspond to the stored one which can be considered as a gauge. During performance of this latter task the discrepancies between the tested network and the original one should be recorded in detail.

In accordance with the two different tasks the apparatus according to the invention has two different modes of operation referred to as "examination" and "control" modes, respectively, and the method can also be divided in similar two cathegories. In examination mode the selector SEL couples the data output of the address generator DMC to the data input 12 of the address generator MPC, while in the control mode the data output of the memory MEM is coupled to the data input 12. The way of operation of the control unit CU depends also on the actual mode.

First the examination mode will be described, and the task of examination lies in the establishment of the internal structure of a network shown in FIG. 2, in which the terminals 1 and 3, as well as 2, 4 and 5 are interconnected. The table of FIG. 3 contains the corresponding data of the address register DMC, the memory addressing circuit MEC and the content of the addressed memory cell which can be divided into DATA and closing bit Z. portions.

For the case of further simplification the content of certain units shown in FIG. 1 will be referred to by means of the letter combination labels associated with such units.

In the beginning DMC=0 which means that the demultiplexer DMPX connects a ground potential to the 0th terminal. In that case the condition DMC=MPC=0 will be set through the selector SEL, and the 0-th input of the multiplexer MPX obtains a passage to the multiplexer output. As a consequence of the ground potential switched on the 0-th terminal, the logical state of the output V will be "1". In this beginning state the MPC=DMC value will be written in the register REG.

The DMC=0 condition will then be maintained, and the value of the address generator MPC will be increased one by one by means of the control unit CU, and in each step when the multiplexer MPX connects the appropriate input to its own output, the actual value of the output V is detected. If V=0 is detected, the address generator MPC will be stepped forward. This is clear, because if V=0 is experienced, then there is no internal connection between the terminal associated with the ectually enabled multiplexer input and the 0-th terminal grounded by the demultiplexer DMPX. In the example of FIG. 2 the 0-th terminal is not connected to any other terminals, therefore the address generator MPC steps forward through n steps and during that time the multiplexer MPX enables the detection of the state of each terminal. When the n-th condition is reached, the following events take place:
a logical level "1" is coupled to the line 13 by the control unit CU,
the number stored in the register REG is written in the DATA field of the actually addressed cell of the memory MEM. During this writing operation the value "1" will be written in the memory as closing bit Z=1.

Now the memory addressing circuit MEC is in the 0-th condition (MEC=0) and the writing occurs in the 0-th memory cell. When the writing operation is finished, the memory address will be increased by 1, i.e. MEC=1 is obtained. By this step the examination of the 0-th terminal is finished. Similar examinations will be cyclically repeated in case of the subseqeunt terminals, and such cycles will be referred to as cycles A. In the following step the setting of the address generator DMC takes place. In the present example this means the simple increase of the previous value DMC=0 by 1, i.e. DMC=1 will be set, whereby the ground potential is switched on the first terminal on the network NW. The setting of the address generator DMC takes place in separate cycles referred to as cycles B.

When the demultiplexer DMPX has been set to DMC=1, the stepping of the multiplexer MPX takes place which occurs in a further cycle A. In the second cycle A the DMC=MPC value will first be set, which is now equal to 1. The setting of the multiplexer MPX to a value smaller then DMC is unnecessary, since in the previous cycle the connection between the 0-th and first terminals has already been examined.

When the MPC=1 is set, the ground potential of DMC=1 occurs at the multiplexer output V, and the value of the address generator MCP (now 1) is written again in the register REG. This is followed by the stepping of the address generator MPC one by one, and the state of the output V is watched. In case of MPC=2, V=0 is obtained because in the second input the path towards the ground is broken. In the third terminal, however, when MPC=3, V=1 is detected, which indicates that the third terminal is connected with the first one. In that case the following events take place:

the content of the register REG is written in the memory MEM in the address MEC=1, and the memory addressing circuit MEC is stepped forward and MEC=2 is obtained. During the writing operation the control unit CU connects the output V with the line 13, therefore the value of the closing it will be Z=1;

thereafter the value MPC=3 is written in the register REG and the address generator MPC is stepped forward one by one. If no further logical value "1" is detected, then in case of reaching the n-th terminal, the already described events will be repeated, i.e. the register value (number 3) together with the value "0" connected to the line 13 as a closing bit will be written in the actually addressed (MEC=2) memory cell and the memory address is increased, i.e. MEC=3 is obtained.

This means the end of this cycle A, and the next cycle B can be started.

In this cycle B the demultiplexer address is increased by one, i.e. DMC=2 is set, and the ground potential is connected to the second terminal, furthermore the DMC=MPC=2 condition is set. By this condition the cycle B is finished and a further cycle A is started.

In this cycle A the MPC=2 value is written in the register REG, and the multiplexer MPX steps forward beginning from the second position and the value of the output V is watched. While the second terminal is interconnected with the fourth terminal, when the MPC=4 condition is set, V=1 is obtained. Consequently the memory operations characteristic to the cycle A will be repeated, i.e.:

the content of the register REG together with the V=Z=1 value will be written in the actually adressed (MEC=3) cell of the memory MEM. The memory address is increased by one (MEC=4).

the actual MPC=4 value is written in the register REG. Following this writing sub-cycle, the multiplexer address is increased by one (MPC=5), and now again V=1 is detected, thus a further writing sub-cycle is started, in which the value MPC=4 stored in the register REG is written in the address MEC=4 together with the closing bit Z=1, the memory address is increased by one (MEC=5 is obtained), and the value MPC=5 is written in the register REG.

In the further steps of the multiplexer MPX the V=1 value will not be obtained any more, and upon reaching the n-th terminal, the closing sub-cycle is repeated, i.e. the value MPC=5 stored in the register REG and the closing bit "0" sent to the line 13 will be written in the address MEC=5, the memory address is increased (MEC=6 is obtained) and the cycle A is finished.

This will be followed by an other cycle B. The full logical condition system of building the cycle B can be explained only now.

In the beginning the value of the address generator DMC will be increased by one. Now DMC=3 is obtained. Looking at FIG. 2 it can be seen that in case of DMC=3 the ground potential is switched on the terminal 3 of the network NW. In this position the measurements become unnecessary, since the interconnection of the first and third terminals has already been detected, and in case of DMC=1 all possible connections of the first terminal were examined. This explains that the examination should not be repeated with DMC=3, because such examination would not give any new information, would require superfluous memory space and it would reduce the overall view on the stored data. The condition DMC=3 will therefore not be set, and the next value DMC=4 is adjusted. In this condition there is again no worth making an examination because this was already done in connection with terminal 2, therefore the DMC=4 can also be stepped over. A similar situation is obtained in the next DMC value, i.e. when DMC=5 because this is also identical with the situation obtained when DMC=2 was set. The next stable step for the address generator DMC is therefore DMC=6, in which no examination was carried out so far.

These conditions must be examined at the beginning of each cycle B, and the next cycle A can only be started, when the address generator DMC has been set to a subsequent stable state. In the appratus shown in FIG. 1 the examination in the cycles B can be made as follows:

At the end of the cycle A preceding this cycle B the memory addressing circuit MEC was set to the next free memory address, i.e. to MEC=6. Up to this time the first counter CNT1 was stepped together with the memory addressing circuit MEC (in the cycle A), and it has a value "6". At the beginning of the cycle B the stepping of the first counter CNT 1 is finished and the memory addressing circuit MEC will be set by the second counter CNT 2 which is stepped one by one from a zero position. In that case the address generator DMC has a value which is by one higher than that taken at the end of the previous cycle A, i.e. it is now DMC=3. During stepping the memory address from zero, the memory content is read in each memory address and the DATA field is compared to the DMC=3 value. The comparison is made by the first comparator KOM 1 which watches the DMC=DATA condition only. If the comparator KOM 1 does not indicate such an identity, then the examination will be continued on the next memory address. From the table of FIG. 3 it can be seen that in the example in the address of MEC=2 the DATA field has a value of DATA=3 which is the same as the actual DMC value. This identity is detected by the first comparator KOM 1, and in response to the identity condition the following events take place:

the address generator DMC steps forward by one step, and the second counter CNT 2 returns to zero setting again. The examination of DMC=DATA will be repeated with each memory address. In the example the DMC=4 will be found in the address of MEC=4 and the DMC=5 will be found in the address MEC=5.

This process can be repeated until the next free memory address set in the end of the preceding cycle is reached. This address is stored in the blocked first counter CNT 1. The second comparator KOM 2 is adjusted to watch the identity CNT 1=CNT 2, and if this condition is true, then the actual memory address is equal to that set in the end of the preceding cycle A, in the exemplary case this is 6. This condition indicates the end of the cycle B.

By the alternative use of the cycles A and B the following advantages are obtained:

(a) the utilization of the memory MEM will be at optimum;

(b) in each group of terminals which are internally interconnected the terminal numbers are stored in subsequent memory addresses, and the first member of each group is always stored in a memory address that follows an address in which the value of the closing bit is "0", and the group terminates in the next address in which the closing bit is again "0";

(c) each "0" value in the closing bit indicates that the terminal stored in the corresponding DATA field is not connected to any other terminal with higher serial number;

(d) the time required for the examination will be at minimum;

(e) when the "n" memory cells are filled with data, this means that the internal structure of interconnections of the network NW is already recorded in the memory MEM, i.e. the examination has finished.

The above described logical system can easily be written in an algorythmical form, and the system can be implemented by hardward means as shown in FIG. 1, and the logical design of the control unit CU is an obvious consequence of the conditions set out hereinabove. The control unit CU can be realized either by sequential logical circuits or by means of processor operations.

In the control mode it is required that the internal interconnection system of the network NW be already known and stored in the memory. The control includes the checking of an actual network NW connected to the apparatus according to the invention whether the internal structure of interconnections thereof is in full correspondence with that stored in the memory. If discrepancy is detected, both the numbers of the concerned terminals and the character of the fault (break or short-circuit) should be indicated.

This task can be carried out also by the apparatus shown in FIG. 1 as follows:

When the network NW has been connected to the apparatus the contents of each cell of the memory MEM is read out, and the read values of the DATA fields will set the address generators DMC and MPC. In that case the selector SEL is in the second position, in which the data output line 14 of the memory MEM is coupled to the data input 12 of the address generator MPC.

The control mode will be described on the basis of the table shown in FIG. 3. When the 0-th memory address (MEC=0) is read, the content of the cell is: DATA=0, Z=0. The number 0 is read in the address generator DMC. The demultiplexer DMPX switches a ground potential to the 0-th terminal. A significant factor in the control operations is the value of the closing bit Z. In the present case Z=0 which indicates that the 0-th terminal is not connected with any other terminal. From this it follows that the further checking operations can include short-circuit tests, i.e. the examination whether the ground potential switched on the 0-th terminal occurs due to an unwanted short-circuit on any further terminals.

In accordance with this principle in the short-circuit testing cycle the control unit CU does not forward any write enable signal to the address generator DMC which will keep its position. The memory addressing circuit MEC will now be stepped until the position n is reached, and in each step the content of the addressed memory cell is read. Since the memory content sets the position of the address generator MPC, practically together with the reading operations the multiplexer MPX is set to the terminals defined by the memory content. In principle, in each of these steps there is the possibility of examining the logical value of the output V, but such examination would surely include redundant operations, since if an internally interconnected group of terminals gets short-circuited, then the short-circuit condition occurs in each concerned terminal separately, and the separate identifications of these short-circuits are unnecessary and they can render the fault location difficult. From that reason in the short-circuit testing cycles the value of the closing bit Z is watched in all memory reading operations, and the logical value of the output V is checked only if the value of the closing bit is Z=0, which means that the corresponding terminal is the last one of an internally interconnected group of terminals. In the table of FIG. 3 (in which the column DMC can not be interpreted in control mode) therefore in the third and fourth memory addresses (DATA=MPC=2 and DATA=MPC=4 positions) no checking is carried out, and the output V is checked only in the position DATA=MPC=5 read out in the address MEC=5. If the logical value of the output V is 0, then the stepping of the memory addressing circuit MEC is continued till the last n-th address. If the checked value is found to be "1", then an error indication is made, and the control unit CU supplies the actual values of the address generators DMC and MPC, respectively to a printer not shown in the drawing, which prints the numbers of the short-circuited terminals.

When the short-circuit testing cycle is finished, the writing of the address generator DMC will be enabled and the next memory address MEC=1 is set. Whether the next cycle will be a further short-circuit test or a continuity test is decided by the value of the closing bit Z. If the closing bit is again zero (Z=0), then a further short-circuit test cycle is made according to the logical conditions set out above. In the example, however, in the address of MEC=1 Z=1 is read, which means that the terminal stored in the first address is connected to at least one other terminal. The task of the control operation lies in testing the continuity of this connection. In case of continuity test always two adjacent memory addresses are read. The content of the DATA field in the first address sets the address generator DMC and the content read in the second address sets the address generator MPC. In the example in the address MEC=1 DMC=1 is set, and the number 3 read out in the next address MEC=2 is used to set the address generator MPC to the position 3. In FIG. 2 it can be seen that the continuity test is justified because between the actually tested terminals (terminals 1 and 3) there must be a connection. If during the test the value of the output V is "1", then the continuity is correct and there is no need for an error indication. Thereafter the address generatord DMC and MPC should be set to the numbers read out in the next memory addresses, i.e. to DMC=3 read out in MEC=2 and to MPC=2 in case of MEC=3. The test will be again a short-circut test, because in the address of MEC=2 the closing bit is Z=0.

In the following addresses continuity tests are made again. The continuity tests of the interconnected terminals 2, 4 and 5 (made by means of the adjustment of the address generators DMC and MPC to the data stored in directly adjacent memory addresses) will include the following measurements:

(a) MEC=3 DMC=2; MEC=4 MPC=4 measurement between the terminals 2 and 4;
(b) MEC=4 DMC=4; MEC=5 MPC=5 measurement between the terminals 4 and 5.

When the following step is made, i.e. when: MEC=5 DMC=5; MEC=6 MPC=6, then the closing bit is Z=0 in the address of MEC=5 and a short-circuit test will be made.

The control mode consisting of the short-circuit and continuity test cycles is preferable because it does not include any redundant examination, it delivers the numbers of the erroneously connected terminals, the type of the fault and it is quick and simple. Especially in the control of a network NW which has a high number of terminals, it is possible to carry out the control between predetermined memory addresses only, e.g. if an intervention is made in the network in a given area or if a predetermined interconnection is of high significance. To carry out such a limited control the first and last required addresses of the memory addressing circuit MEC should only be adjusted, which can be made by means of appropriate registers or by processor operations.

We claim:

1. A method for the examination of an internal interconnection system between n terminals of an electrical network and for storing the results in a memory comprising n memory cells by means of sensing the existence or absence of the signal passage between the terminals, comprising the steps of switching a marking state on the respective terminals by means of a demultiplexer (DMPX) with n outputs controlled by an address generator (DMC), and searching the passage of the marking state by a multiplexer (MPX) with n inputs connected to the terminals and being set by another address generator (MPC), and in each stable state of the demultiplexer (DMPX) the pass-through of the marking state is searched according to the steps of a first cycle designated as cycle A, in each step of said cycle A said multiplexer (MPX) is stepped from the terminal associated with said stable state of the demultiplexer (DMPX) until the last terminal thereof and, in each step observing the state of the multiplexer output and if in said output an active state representing the pass-through of said marking state is detected, the actual address of the multiplexer (MPX) is temporarily stored and, when the next active state in said output is detected, the temporarily stored address is written in the momentarily addressed cell of the memory together with a closing bit having a first logical value associated with said active state, whereafter the next address of the memory is set and the momentary multiplexer address is stored temporarily, and this sequence of steps is continued until the multiplexer (MPX) is connected to the n-th, last terminal, and in the next step the temporarily stored address is written in the momentarily addressed cell of the memory together with a closing bit having a first logical value associated with said active state, whereafter the next address of the memory is set and the momentary multiplexer address is stored temporarily, and this sequence of steps is continued until the multiplexer (MPX) is connected to the n-th, last terminal, and in the next step the temporarily stored address is written in the next free address of the memory (MEM) together with a closing bit having a second logical value inverted relative to said first logical value, and stepping the memory (MEM) to the next address, then starting a second B-type cycle for adjusting the next stable state of the demultiplexer (DMPX), in which the demultiplexer address is increased by respective steps and in each step this address is compared with the contents of the already filled memory cells and if identity is found, the demultiplexer address is increased by a step and, said increased step is compared to the content of the already written memory cells beginning with the first cell, and if the contents of the filled memory cells is found not to coincide with the actual demultiplexer address, then said actual address is accepted as a stable demultiplexer address, then a further cycle A is started, and by means of the alternating series of the cycles A and B all the n cells of the memory (MEM) are written in.

2. The method as claimed in claim 1, in which the logical valve of said closing bit is defined as "1" if the multiplexer output (V) is found to be active, and said logical value is defined as "0" in the step following the examination of the n-th terminal.

3. A method for testing the identity of an internal interconnection system interpreted among terminals of a network with that of a standard network, in which the internal interconnection of the standard network is recorded in a memory according to claim 1 comprising the steps of switching a marking state on the respective terminals of the network under test by means of a demultiplexer (DMPX) addressed by an address generator (DMC), and by means of a multiplexer (MPX) with inputs connected to said terminals and addressed by a second address generator (MPC), the arrival of the marking state to the multiplexer output is tested as a proof of short-circuit or as a continuity test between the actually connected terminals, wherein the short circuit and contunuity test examinations are carried out in alternating cycles, in the short circuit control cycles the demultiplexer (DMPX) is set to addresses for which is true that in the memory cell with the same address the value of the closing bit corresponds to said second logical value, and during maintaining such demultiplexer states the memory address is increased by steps and, in each step the memory content is read and when the read value of the closing bit corresponds to said second logical value, then the muliplexer (MPX) is set to the address stored in the same memory cell and the output state thereof is examined, and if in said output the marking state corresponding to a short-circuit is detected, then an error indication is made, following the end of each step of said cycle the memory cell with the next address is read and the demultiplexer (DMPX) is set to the position corresponding to the number stored in said cell, and if the value of the closing bit stored in said cell has the second logical value, then another short-circuit test cycle is started, and if the closing bit has the first logical value, then a second type continuity test cycle is started, in said second type the multiplexer (MPX) is set to the position determined by the number stored in the memory cell with the next address, and the state of the multiplexer output is detected, and if an absence of a marking state, said marking state defining a continuity, is measured, an error indication is made, and if continuity is detected, then the demultiplexer (DMPX) is set to the position defined by the number stored in the memory cell with said next address and, depending on the value of the closing bit stored in said cell a further short-circuit or continuity test cycle is started.

4. The method as claimed in claimed 3, wherein during each error indication, the actual positions of the demultiplexer (DMPX) and of the multiplexer (MPX) are recorded.

5. The method as claimed in claim 3 wherein said tests are carried out in a range defined between two predetermined limit memory addresses, in which the demultiplexer (DMPX) is set first to the position stored in one of said limit addresses, and the type of the first cycle is defined by the logical value of the closing bit in said address.

6. Apparatus for the examination of an internal interconnection system between n terminals of an electrical network comprising a demultiplexer (DMPX) comprising outputs connected to the n terminals of the network (NW) under test, a multiplexer (MPX) comprising inputs connected to said terminals, a first address generator (DMC) connected to address input of the demultiplexer (DMPX), a second address generator (MPC) connected to address input of the multiplexer (MPX), a register (REG) connected to the output of the multiplexer (MPX) for temporarily storing the value of said output, a selector (SEL) settable according to the required mode of operation and comprising an output connected to the address input of the second address generator (MPC), a first input connected to the output of the first address generator (DMC), a memory (MEM) comprising n cell which has data inputs connected with one exception to the outputs of the register (REG), the data output of the memory (MEM) are connected with one exception to the address input of the first address generator (DMC) and a second input of the selector (SEL), a memory addressing circuit (MEC) coupled to the address input of the memory (MEM), a means for determining the identity of the memory content and the actual position of the first address generator (DMC), a means for temporary storage of given states of the memory addressing circuit (MEC) and for indicating when the memory addressing circuit (MEC) takes said states again, and a control unit (CU) receiving the output of the multiplexer (MPX), the remaining one data output of the memory (MEM), the output of the means for determining the identity and the output of the temporary storage means, said control unit (CU) comprises control outputs for setting the remaining one data input of the memory (MEM) and for controlling the first and second address generators (DMC, MPC), the selector (SEL), the register (REG), the memory addressing circuitry (MEC) and the memory (MEM).

7. The apparatus as claimed in claim 6, wherein said means for determining the identity comprises a first comparator (KCM 1) having a first input connected to the output of the first address generator (DMC) and a second input connected to the data output of the memory (MEM).

8. The apparatus as claimed in claim 6, wherein said temporary storage means comprises first and second counters (CNT 1, CNT 2) controlled by the control unit (CU), one of said counters is connected to a setting input of the memory addressing circuit (MEC), and comprises a second comparator (KOM 2) with inputs connected to output of the first and second counters (CNT 1, CNT 2).

* * * * *